United States Patent
Murakami et al.

(10) Patent No.: US 6,503,579 B1
(45) Date of Patent: Jan. 7, 2003

(54) PLASMA CVD METHOD, PLASMA CVD APPARATUS, AND ELECTRODE

(75) Inventors: Yasuo Murakami, Mukô (JP); Takahiro Nakahigashi, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/403,772

(22) PCT Filed: Mar. 2, 1999

(86) PCT No.: PCT/JP99/00998
§ 371 (c)(1),
(2), (4) Date: Nov. 2, 1999

(87) PCT Pub. No.: WO99/45168
PCT Pub. Date: Sep. 10, 1999

(30) Foreign Application Priority Data

Mar. 5, 1998 (JP) ............................................. 10-053659

(51) Int. Cl.⁷ ........................... H05H 1/46; C23C 16/26; C23C 16/505; C23C 16/509; C25B 11/02
(52) U.S. Cl. .................... 427/577; 427/237; 427/249.1; 427/249.7; 427/569; 118/723 R; 118/723 E; 118/728; 204/280; 204/285
(58) Field of Search .................... 118/723 E, 724, 118/728, 733, 715, 723 R, 723 I; 427/237, 238, 294, 249.7, 569, 577, 255.39, 249.1, 906; 148/563; 204/280, 285

(56) References Cited

U.S. PATENT DOCUMENTS

| | | | | |
|---|---|---|---|---|
| 4,746,538 A | * | 5/1988 | Mackowski | 427/38 |
| 4,934,198 A | * | 6/1990 | Doemens | 33/786 |
| 5,041,201 A | * | 8/1991 | Yamazaki et al. | 204/192.32 |
| 5,073,785 A | * | 12/1991 | Jansen et al. | 346/1.1 |
| 5,120,175 A | * | 6/1992 | Arbegast et al. | 411/501 |
| 5,374,314 A | * | 12/1994 | Babacz | 118/723 |
| 5,562,952 A | * | 10/1996 | Nakahigashi et al. | 427/534 |
| 5,669,991 A | * | 9/1997 | DeFilippo | 148/563 |

FOREIGN PATENT DOCUMENTS

| | | | |
|---|---|---|---|
| EP | 0233825 B1 | | 8/1987 |
| EP | 0359567 B1 | | 3/1990 |
| EP | 0233825 B1 | * | 4/1991 |
| EP | 0454995 B1 | | 11/1991 |
| EP | 0359567 B1 | * | 8/1994 |
| EP | 0454995 B1 | * | 12/1994 |
| EP | 0653501 B1 | | 5/1995 |
| EP | 0 997 554 A1 | | 5/2000 |
| JP | 62-284081 | | 12/1987 |
| JP | 2-80571 | | 3/1990 |
| JP | 4-229277 | | 8/1992 |
| JP | 07278822 A | | 10/1995 |
| JP | 08053117 A | | 2/1996 |
| JP | 08053117 A | * | 2/1996 |
| JP | 09137273 A | | 5/1997 |

* cited by examiner

Primary Examiner—Shrive P. Beck
Assistant Examiner—Wesley Markham
(74) Attorney, Agent, or Firm—Arent Fox Kintner Plotkin & Kahn

(57) ABSTRACT

The invention provides a plasma CVD method and device which can form a uniform or substantially uniform film on an outer surface of an object independently of the shape of the object, and also provides an electrode used in the method and device. More specifically, a plasma is formed from a deposition material gas by supplying an electric power to the gas, and a film is formed on the outer surface of a hollow object having an opening under the plasma. The electrodes for supplying the electric power for forming the gas plasma include an internal electrode arranged in an inner space of the hollow object and an external electrode arranged outside the object. The internal electrode can selectively have a reduced form allowing passage of the electrode through the opening of the hollow object and an enlarged form predetermined in accordance with the volume and shape of the inner space of the object.

17 Claims, 5 Drawing Sheets

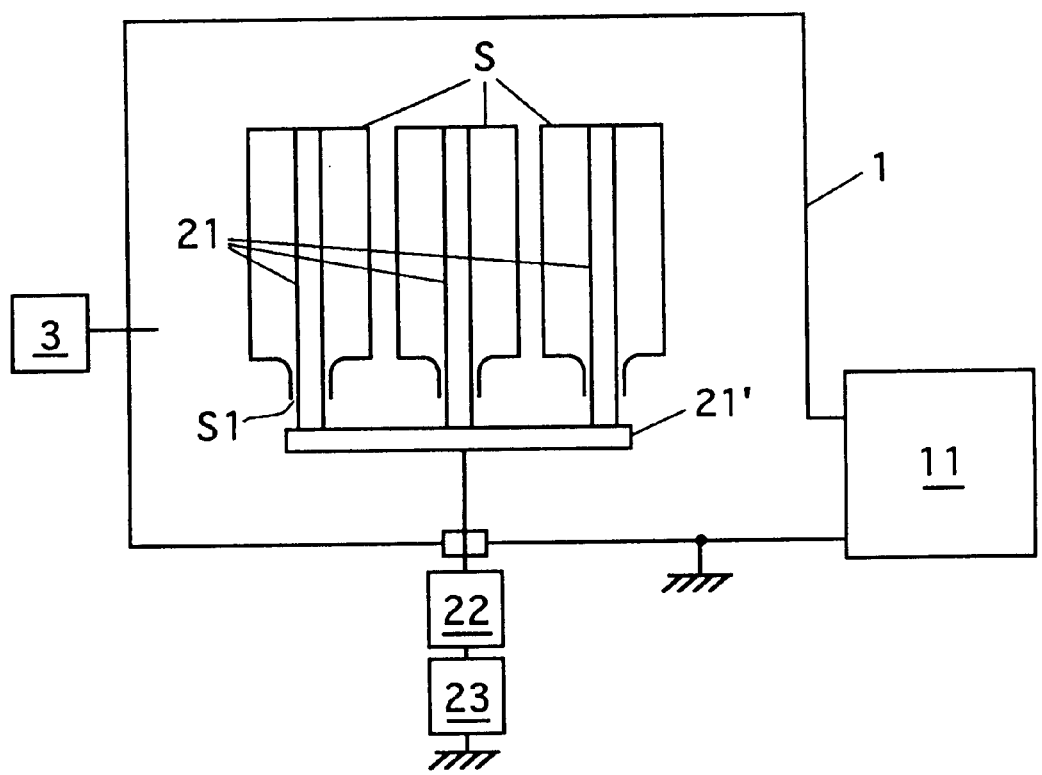
Fig.9(PriorArt)

PLASMA CVD METHOD, PLASMA CVD APPARATUS, AND ELECTRODE

TECHNICAL FIELD

The present invention relates a plasma CVD (Chemical Vapor Deposition) method for forming or depositing a film on an external surface of a hollow object or good having an opening, and also relates to a plasma CVD device and an electrode which can be used in the above method.

BACKGROUND ART

Resin has been used as materials, of many kinds of containers which are used in a food field, a medicine field and others. The resin products have advantages such as a light weight, a high resistance against impact and a low cost. However, the container made of resin has a poor gas-barrier property, and therefore suffers from such problems that contents are susceptible to oxidation, and a gas such as a carbon dioxide gas in the contents is liable to be externally discharged. Since the container is relatively soft, it is liable to be damaged by the contact with another good.

In view of the above, it has recently been attempted to form a hard carbon film such as a DLC (Diamond Like Carbon) film on a surface of a resin container in view of the fact that the hard carbon film has good properties such as a good wear resistance and a good gas barrier property.

For example, Japanese Laid-Open Patent Publication No. 8-53117 has disclosed the following method and device. In these method and device, a container to be subjected to film deposition is arranged in a hollow external electrode. This hollow external electrode has an inner space which is geometrically similar to but is slightly larger than the container. An internal electrode having a thin rod-like form is inserted into the container through its inlet or opening. The internal electrode arranged in the container is used as a gas nozzle, from which a film material gas or deposition material gas is introduced into the container, and a high-frequency electric power for forming gas plasma is supplied across the inner and outer electrodes Thereby, the carbon film is formed on the inner surface of the container. According to the foregoing publication, in these method and device, a negative self-bias is generated on the external electrode extending along the outer surface of the container so that the film can be deposited uniformly on the inner surface of the container, and since the discharge region is narrow, gas exhausting can be performed efficiently, and a required amount of the deposition material gas can be small so that the productivity is high.

A plasma CVD device, e.g., shown in FIG. 9 is also used for forming a film such as a carbon film on an external surface of a deposition target object having a container-like form. This device has a vacuum chamber 1, which is connected to an exhausting device 11, and is kept at a ground potential. A plurality of rod-like internal electrodes 21 are arranged in the chamber 1, and are carried on an electrically conductive support member 21'. The internal electrodes 21 and the conductive support member 21' are electrically isolated from the chamber 1. A matching box 22 and a high-frequency power source 23 are connected in this order to the internal electrodes 21 via the support member 21'.

The vacuum chamber 1 is connected to a gas supply portion 3 of the deposition material gas. The gas supply portion 3 includes a mass-flow controller, a valve and a gas source, which are not shown in the figure.

For forming the films by the above device on the outer surfaces of the container-like deposition target objects S, i.e., the hollow objects S having the openings S1, the deposition target objects S are put into the chamber 1, and are fitted onto the internal electrodes 21 for supporting the objects S by the electrodes 21, respectively. Then, an exhaust device 11 operates to reduce the pressure in the chamber 1 to a predetermined pressure, and the deposition material gas is introduced from the gas supply portion 3 into the chamber 1. Also, the high-frequency power source 23 supplies a high-frequency power for plasma formation to the internal electrodes 21 via the matching box 22 so that the material gas thus introduced is changed into plasma. Under the plasma thus formed, the film is deposited on the outer surface of each deposition target object S having the container like form. The batch processing is performed to deposit simultaneously the films on the deposition target objects S equal in number to the internal electrodes 21.

According to the plasma CVD method and device taught by the Japanese Laid-Open Patent Publication No. 8-53117, since the carbon film is formed on the inner surface of the container, an effect of preventing damages, which may be caused by contact with another object, cannot be achieved.

In the film deposition process using the plasma CVD device shown in FIG. 9, the internal electrode supplied with the high-frequency power has a thin rod-like form and has a diameter smaller the inner diameter of the opening S1 of the deposition target object. Therefore, a plasma sheath which is formed around the internal electrode with the object wall therebetween may not extend along the outer surface of the deposition target object in some cases depending on the form thereof, and thereby it may be difficult to form a uniform film on the outer surface. Since the discharging occurs entirely in the vacuum chamber, the exhausting efficiency is low, and a large amount of deposition material gas is required, resulting in a low productivity.

Accordingly, an object of the invention is to provide a plasma CVD method of forming a film on an outer surface of a hollow object having an opening, and, particularly a plasma CVD method which can form a uniform or substantially uniform film on the outer surface of the object independently of the shape of the object.

Another object of the invention is to provide a plasma CVD method of forming a film on an outer surface of a hollow object having an opening, and particularly a plasma CVD method which can form the film on the outer surface of the object with a good productivity.

Still another object of the invention is to provide a plasma CVD device for forming a film on an outer surface of a hollow object having an opening, and particularly a plasma CVD device which can form a uniform or substantially uniform film on the outer surface of the object independently of the shape of the object.

Yet another object of the invention is to provide a plasma CVD device for forming a film on an outer surface of a hollow object having an opening, and particularly a plasma CVD device which can form the film on the outer surface of the object with a good productivity.

A further object of the invention is to provide an electrode which can be used in the above method and device.

DISCLOSURE OF THE INVENTION

For achieving the above objects, the invention provides a plasma CVD method, a plasma CVD device and an electrode, which are described below and belong to a first type.

Plasma CVD Method of the First Type

A plasma CVD method for forming a plasma from a deposition material gas by supplying an electric power to the gas, and forming a film on an outer surface of a hollow object having an opening under the plasma, wherein an internal electrode to be arranged in an inner space of the hollow object and an external electrode to be arranged outside the object are prepared as electrodes for supplying the electric power for forming the gas plasma, the internal electrode being capable of selectively having a reduced form allowing passage of the electrode through the opening of the hollow object and an enlarged form predetermined in accordance with a volume and a shape of the inner space of the object, the internal electrode having the reduced form is inserted into the inner space of the object through the opening of the object before forming the film on the outer surface of the object, then is changed into the enlarged form and is kept within the object, and the electric power for forming the gas plasma is supplied across the internal electrode and the external electrode for forming the film on the outer surface of the object.

Plasma CVD Device of the First Type

A plasma CVD device for forming a plasma from a deposition material gas by supplying an electric power to the gas, and forming a film on an outer surface of a hollow object having an opening under the plasma, comprising:

an internal electrode to be arranged in an inner space of the hollow object and an external electrode to be arranged outside the object as electrodes for supplying the electric power for forming the gas plasma, and the internal electrode being capable of selectively having a reduced form allowing passage of the electrode through the opening of the hollow object and an enlarged form predetermined in accordance with a volume and a shape of the inner space of the object.

Electrode of the First Type

An internal electrode used in plasma CVD for forming a plasma from a deposition material gas by supplying an electric power to the gas, and forming a film on an outer surface of a hollow object having an opening under the plasma, the internal electrode being arranged in the inner space of the hollow object for allowing supply of the electric power for plasma formation across the internal electrode and an outer electrode arranged outside the hollow object, wherein the internal electrode can selectively have a reduced form allowing passage of the electrode through the opening of the hollow object and an enlarged form predetermined in accordance with a volume and a shape of the inner space of the object.

For achieving the above objects, the invention also provides a plasma CVD method, a plasma CVD device and an electrode, which are described below and belong to a second type.

Plasma CVD Method of the Second Type

A plasma CVD method for forming a plasma from a deposition material gas by supplying an electric power to the gas, and forming a film on an outer surface of a hollow object having an opening under the plasma, wherein an internal electrode to be arranged in an inner space of the hollow object and an external electrode to be arranged outside the object are prepared as electrodes for supplying the electric power for forming the gas, plasma, the internal electrode including an electrically conductive and flowable material capable of flowing between the inner and outer spaces of the object through the opening of the object, the internal electrode is formed by flowing the conductive and flowable material into the inner space of the object through the object opening before forming the film on the outer surface of the object, and the electric power for forming the gas plasma is supplied across the internal electrode and the external electrode for forming the film on the external surface of the object.

Plasma CVD Device of the Second Type

A plasma CVD device for forming plasma from a deposition material gas by supplying an electric power to the gas, and forming a film on an outer surface of a hollow object having an opening under the plasma, comprising:

an internal electrode to be arranged in an inner space of the hollow object and an external electrode to be arranged outside the object as electrodes for supplying the electric power for forming the gas plasma, the internal electrode including an electrically conductive and flowable material capable of flowing between the inner and outer spaces of the object through the opening of the object, and the internal electrode being formed by flowing the conductive and flowable material into the inner space of the object.

Electrode of the Second Type

An internal electrode used in plasma CVD for forming a plasma from a deposition material gas by supplying an electric power to the gas, and forming a film on an outer surface of a hollow object having an opening under the plasma, the internal electrode being arranged in the inner space of the hollow object for allowing supply of the electric power for plasma formation across the internal electrode and an outer electrode arranged outside the hollow object, wherein the internal electrode includes an electrically conductive and flowable material capable of flowing between the inner and outer spaces of the object through the opening of the object, and being flowed into the inner space of the object to form the internal electrode.

BRIEF DESCRIPTION OF THE DRAWINGS

FIG. 9 shows a schematic structure of an example of a plasma CVD device in the prior art which can form a film on an outer surface of a hollow object.

PREFERRED EMBODIMENTS FOR IMPLEMENTING THE INVENTION

Figure 1:
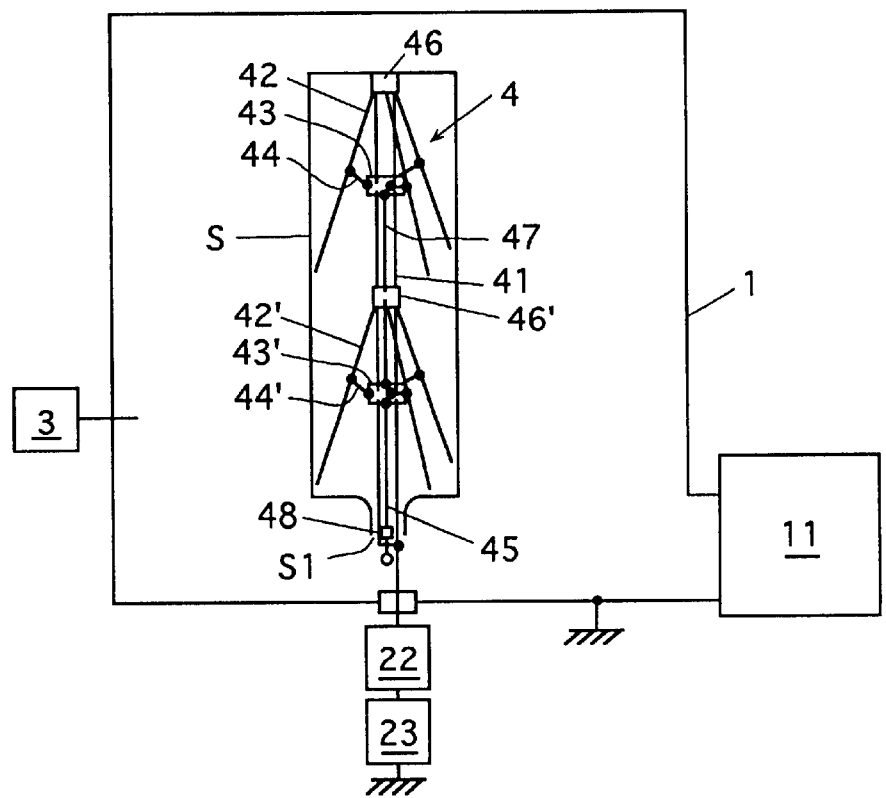
FIG. 1 shows, by way of example a schematic structure of a plasma CVD device according to the invention.

The followings may be a plasma CVD method, a plasma CVD device and an electrode of a preferred embodiment of the invention.

A plasma CVD method of a preferred embodiment of the invention is a plasma CVD method for forming a plasma from a deposition material gas by supplying an electric power to the gas, and forming a film on an outer surface of a hollow object having an opening under the plasma.

An internal electrode to be arranged in an inner space of the hollow object and an external electrode to be arranged outside the object are prepared as electrodes for supplying the electric power for forming the gas plasma.

The internal electrode can selectively have a reduced form allowing passage of the electrode through the opening of the hollow object and an enlarged form predetermined in accordance with a volume and a shape off the inner space of the object.

The internal electrode having the reduced form is inserted into the inner space of the object through the opening of the object before forming the film on the outer surface of the object, then is changed into the enlarged form and is kept within the object, and the electric power for forming the gas plasma is supplied across the internal electrode and the external electrode for forming the film on the external surface of the object.

A plasma CVD device of a preferred embodiment of the invention is a plasma CVD device for forming a plasma from a deposition material gas by supplying an electric power to the gas, and forming a film on an outer surface of a hollow object having an opening under the plasma.

The plasma CVD device comprises an internal electrode to be arranged in an inner space of the hollow object and an external electrode to be arranged outside the object as electrodes for supplying the electric power for forming the gas plasma.

The internal electrode can selectively have a reduced form allowing passage of the electrode through the opening of the hollow object and an enlarged form predetermined in accordance with a volume and a shape of the inner space of the object.

An electrode of a preferred embodiment of the invention is an internal electrode used in plasma CVD for forming a plasma from a deposition material gas by supplying an electric power to the gas, and forming a film on an outer surface of a hollow object having an opening under the plasma, the internal electrode being arranged in the inner space of the hollow object for allowing supply of the electric power for plasma formation across the internal electrode and an outer electrode arranged outside the hollow object.

The internal electrode can selectively have a reduced form allowing passage of the electrode through the opening of the hollow object and an enlarged form predetermined in accordance with a volume and a shape of the inner space of the object.

According to the plasma CVD method, plasma CVD device and electrode described above, the electrode to be arranged in the inner space of the hollow deposition target object can have the enlarged form corresponding to the volume and shape of the inner space of the object, whereby a plasma sheath can be formed in a region which extends along or substantially long the outer surface of the object so that the uniform or substantially uniform film can be formed on the surface.

Owing to the above, the reduced form and the enlarged form of the internal electrode can be determined in accordance with the shape of the hollow object even if the object has a relatively large inner diameter as compared with the inner diameter of the opening, or the hollow object has an irregular form such as a curved form. Thereby, the uniform or substantially uniform film can be formed on the outer surface of the object.

The hollow object which is the deposition target object is required to have a hollow form having at least one opening, and additionally is required to have a thickness which allows arrangement of the outer surface of the object within a plasma sheath formed along the internal electrode.

The internal electrode used in the plasma CVD may be, e.g., closable so that the electrode in the closed state can be in the reduced form, and the electrode in the open state can be in the enlarged state.

For film formation on the object, the internal electrode is closed to attain the reduced form, and is inserted into the inner space of the object through the opening of the object before forming the film on the outer surface of the object. Then, the internal electrode is opened to attain the enlarged form, and is kept within the object, and the electric power for forming the gas plasma is supplied across the internal electrode and the external electrode for forming the film on the external surface of the object.

The internal electrode which can be opened and closed may include a central member, a closable member connected to the central member in a closable fashion, and a drive portion for opening and closing the closable member so as to attain the reduced or enlarged form.

The internal electrode may have (1) a structure which can be opened and closed in an umbrella-like manner, or (2) a structure including a flexible sheet-like electrode member which can be unrolled along the inner wall of the inner space of the object to attain the open state, and can be rolled up to attain the closed state.

(1) More specifically, the internal electrode which can be opened and closed in the umbrella-like manner can have a structure, in which a predetermined number of closable members are arranged around a rod-like central member with a predetermined angular space between each other, each of the closable members has an end rotatably connected to a predetermined portion of the central member and the other end rotatably connected to a ring member slidably fitted around the central member, a drive member for sliding the ring member on the central member is coupled to the central member, and the drive member can slide the ring member to close the closable members for attaining the reduced state, and to open the closable members for attaining the enlarged state. In this case, a group of the plurality of closable members and the ring member coupled thereto may be arranged in each of a plurality of tandem positions on the central member. A stop device may be employed for unmovably coupling the drive member to the central member while keeping the entire structure in the reduced form or the enlarged form.

More specifically, the internal electrode employing the flexible sheet-like electrode member of the above item (2) may include an outer cylindrical member being movable through the object opening, a central axis rod (central member) rotatably supported in the outer cylindrical member, and a flexible sheet-like electrode member having an end connected to the axis rod, and being moved between positions inside and outside the outer cylindrical member through a slit formed in the outer cylindrical member by an operation of rotating the axis rod. The reduced form can be achieved by rotating the central axis rod to roll up the sheet-like electrode member, and the enlarged form can be achieved by rotating the central axis rod to pay out the sheet-like electrode member along the inner wall surface of the object space.

The internal electrode used for the plasma CVD may be made of a shape-memory alloy and may be configured to be set to the enlarged form at a temperature taking the memory shape and to be set to the reduced form by changing the shape at a lower temperature allowing change in shape.

For forming a film on the deposition target object, the internal electrode is deformed into the reduced form at the low temperature and is put into the inner space of the object through the opening of the object, and then the internal electrode is set to the temperature taking the memory shape for restoring the enlarged form. Then, the power for the gas plasma formation is supplied across the internal and external electrodes to form the film on the outer surface of the object.

The electrode made of the shape-memory alloy may typically take the enlarged form in the matrix phase of the shape-memory alloy, and may be changed-into the reduced form when it is in the martensite phase.

In any one of the above examples, the temperature of the internal electrode can be controlled during and/or before the film deposition (particularly, during film formation) for achieving the enlarged state and the reduced state when necessary. For this, the internal electrode may be provided with a temperature control device for achieving the enlarged and/or reduced forms. The temperature control device may include a heater and/or cooler combined with the internal electrode, may be a device for flowing a gas or liquid at a controlled temperature through an internally formed fluid passage, may include a gas or liquid contained in the internal electrode for temperature control, may include a heater and/or cooler for controlling a temperature of the fluid thus contained, or may include, e.g., an appropriate combination of them.

The shape-memory alloy may be appropriately selected from a group of alloys containing Ti—Ni, Cu—Zn—Al, Cu—Al—Ni, Cu—Zn, In—Tl, Ni—Al and Fe—Pd, although not restricted thereto. For example, it is desired to use a material and a composition ratio, which provide the matrix phase at a deposition temperature (between about 25° C. and 100° C.) in the plasma CVD.

The internal electrode may be a bag-like electrode having at least an electrically conductive outer surface, can be expanded to the enlarged form by supplying a flowable material into the electrode, and can be set to the reduced form by discharging the flowable material from the interior of the electrode.

For forming the film on the object, the bag-like electrode is inserted to the inner space of the object through the object opening, and then is expanded to take said enlarged form by supplying the flowable material into the bag-like electrode. The electrode thus expanded is arranged in the object, and the power for the gas plasma formation is supplied across the internal and external electrodes so that the film can be formed on the outer surface of the object.

The bag-like electrode may be made of an expandable and electrically conductive sheet (e.g., electrically conductive rubber sheet), or may be an electrically conductive sheet having no expandability but can be compressed, e.g., by folding. The bag-like electrode may entirely have an electrical conductivity, or may have an electrical conductivity at only its external surface (e.g., may be provided at its outer surface with a conductive film or a coating of a conductive material). In either case, at least the outer surface must have the electrical conductivity.

The conductive rubber may be a rubber such as styrene-butadiene copolymer (SBR), polybutadiene, (BR), ethylene-propylene-diene terpolymer (EPDM), silicone rubber or fluororubber, which contains an electrically conductive filler such as carbon black powder, graphite powder, metal powder or metal fiber, or may be, e.g., a polyacetylene structurally having the electrical conductivity, although not restricted to them.

The flowable material filling the bag-like electrode may be a fluid such as a liquid or a gas, or may be solid particles having a diameter smaller than the inner diameter of the opening of the hollow object.

In the case where the bag-like electrode entirely has the conductivity, the electric power may be supplied to the electrode via the flowable material arranged in the inner space. In this case, the flowable material may have an electrical conductivity. For example, the flowable conductive material may be mercury which takes the form of liquid at the room temperature, or may be a suspension containing electrically conductive powder such as iron powder. In the latter case, the powder may be desirably suspended in the liquid having a high viscosity for suppressing precipitation of the powder during the film deposition. The flowable material may be made of an electrically conductive solid material such as conductive power or conductive particles.

The followings may be a plasma CVD method, a plasma CVD device and an electrode of another preferred embodiment of the invention.

A plasma CVD method of another preferred embodiment of the invention is a plasma CVD method for forming a plasma from a deposition material gas by supplying an electric power to the gas, and forming a film on an outer surface of a hollow object having an opening under the plasma.

An internal electrode to be arranged in an inner space of the hollow object and an external electrode to be arranged outside the object are prepared as electrodes for supplying the electric power for forming the gas plasma.

The internal electrode includes an electrically conductive and flowable material capable of flowing between the inner and outer spaces of the object through the opening of the object, and the internal electrode is formed by flowing the conductive and flowable material into the inner space of the object through the object opening before forming the film on the outer surface of the object.

The electric power for forming the gas plasma is supplied across the internal electrode and the external electrode for forming the film on the external surface of the object.

A plasma CVD device of another preferred embodiment of the invention is a plasma CVD device for, forming a plasma from a deposition material gas by supplying an electric power to the gas, and forming a film on an outer surface of a hollow object having an opening under the plasma.

The device comprises an internal electrode to be arranged in an inner space of the hollow object and an external electrode to be arranged outside the object as electrodes for supplying the electric power for forming the gas plasma.

The internal electrode includes an electrically conductive and flowable material capable of flowing between the inner and outer spaces of the object through the opening of the object, and the internal electrode can be formed by flowing the conductive and flowable material into the inner space of the object.

An electrode according to another preferred embodiment of the invention is an internal electrode used in plasma CVD for forming a plasma from a deposition material gas by supplying an electric power to the gas, and forming a film on an outer surface of a hollow object having an opening under the plasma, the internal electrode being arranged in the inner space of the hollow object for allowing supply of the electric power for plasma formation across the internal electrode and an outer electrode arranged outside the hollow object.

The internal electrode includes an electrically conductive and flowable material capable of flowing between the inner and outer spaces of the object through the opening of the object, and being flowed into the inner space of the object to form the internal electrode.

According to the plasma CVD method and device, the conductive and flowable material is supplied into the inner space of the hollow object to fill or substantially fill the inner space and thereby form the internal electrode, whereby a plasma sheath can be formed in a region which extends along or substantially along the outer surface of the object so that the uniform or substantially uniform film can be formed on the surface.

The conductive and flowable material may be solid particles (e.g., in the form of grains, powder or flakes) made of an electric conductive material such as iron, stainless steel or alminum and having a smaller size or diameter than the inner diameter of the opening of the hollow object, a conductive and flowable material such as an electrically conductive liquid, or a combination of them.

The electrically conductive fluid may be foregoing mercury which takes the form of liquid at the room temperature, or may be a suspension containing electrically conductive powder such as iron powder. In this case, the powder may be desirably suspended in the liquid having a high viscosity for suppressing precipitation of the powder during the film formation.

In any one of the above cases, the flowable material may be supplied into the object, of which inner surface is covered with a sheet or the like made of, e.g., synthetic resin so as to prevent absorption of the conductive and flowable material onto the inner space wall of the hollow object. A bag made of, e.g., a synthetic resin film may be placed in advance in the object, and thereafter the conductive and flowable material may be supplied into the bag to form the internal electrode.

For supplying the electric power to the conductive and flowable material supplied into the object, an electrode member may be inserted into the conductive and flowable material through the object opening, and the power may be supplied to the material via the electrode member.

In any one of the plasma CVD methods and devices described above, the following manners and structures may be employed.

The external electrode may be formed of a plasma producing chamber itself, in which the hollow object is placed and the plasma is produced, or may be formed of an electrode arranged in the plasma producing chamber and is located outside the object.

Either the internal and external electrodes may be used as the electrode connected to the power source for receiving the power for gas plasma formation. However, the internal electrode may be generally used as the electrode connected to the power source, and the external electrode may be used as a ground electrode.

The power for gas plasma formation may be either a high-frequency power or a DC power.

In the case where the high-frequency power is used as the power for forming the gas plasma, the power may be prepared by effecting amplitude modulation on a basic high-frequency power of a predetermined frequency of 13.56 MHz or more with a modulation frequency in a range from one ten-thousandth to one tenth of the predetermined frequency.

In any one of the plasma CVD devices, means for supplying the power for plasma formation across the internal and external electrodes may be means for supplying the power prepared by effecting amplitude modulation on a basic high-frequency power of a predetermined frequency of 13.56 MHz or more with a modulation frequency in a range from one ten-thousandth to one tenth of the predetermined frequency.

By using such a modulated high-frequency power as the power supplied for forming the plasma from the deposition material gas, the produced plasma can have a high density, and thereby a rate of reaction is improved so that deposition can be performed at a low temperature. By effecting the modulation as described above, the reaction is promoted on the outer surface of the hollow object, i.e., the deposition target object so that the film adhesion can be improved, and the deposition rate can be improved. Thereby, the productivity can be improved. In the case where a carbon film is formed as will be described later, the lubricating property of the film can be improved.

The basic high-frequency power before the modulation may have a waveform such as a sinusoidal, square, sawtooth-like or triangular form. The amplitude modulation may be pulse modulation conducted by on/off of the power supply, or may be another modulation in the form of pulse.

The basic high-frequency power has a frequency of 13.56 MHz or more because the frequency lower than the above tends to cause an insufficient plasma density. The frequency of the basic high-frequency may be, e.g., about 500 MHz or less in view of a cost of the high-frequency power source and others.

The modulation frequency may be in the foregoing range because a modulation frequency smaller than one ten-thousandth of the frequency of the basic high-frequency power significantly lowers the deposition rate. The modulation frequency larger than one tenth make the matching difficult, and lowers the uniformity in film thickness.

The duty ratio ((on-time)/(on-time+off-time)) of the pulse modulation may be in a range from about 10% to about 90%. The ratio lower than 10% would lower the deposition rate. The ratio larger than 90% would excessively increase the power supply time, and therefore would excessively reduce the effect of improving the plasma density which could be achieved by the modulated high-frequency power.

The deposition material gas may be a hydrocarbon compound gas such as methane ($CH_4$), ethane ($C_2H_6$), propane ($C_3H_8$), butane ($C_4H_{10}$), acetylene ($C_2H_2$) or benzene ($C_6H_6$). If necessary, the material gas may be a mixture of the above hydrocarbon compound gas and a carrier gas such as a hydrogen gas, an inert gas or the like. With the above gas, a carbon film can be formed on the outer surface of the hollow object.

As the deposition material gas for the carbon film, it is desired to use a mixture of the foregoing hydrocarbon compound gas and a gas of fluorocarbon compound such as a tetrafluoromethane ($CF_4$) gas, a hexafluoroethane ($C_2F_6$) gas, an octafluorocyclobutane ($C_4F_8$) gas or the like. For forming the carbon film deposition, the gas may be the mixture of the hydrocarbon compound gas and the fluorocarbon compound gas, whereby the deposition rate can be improved. Thereby, the productivity can be improved. Further, the film stress can be reduced so that the film adhesion can be improved. Also, effects such as improvement of the gas barrier property and the lubricating property can be improved.

In the case where the gas mixture of the hydrocarbon compound gas and the fluorocarbon compound gas are used as the deposition material gas, it is preferable for improving the deposition rate that the mixing ratio (i.e., ratio of (fluorocarbon) to (fluorocarbon+hydrocarbon)) of the fluorocarbon compound gas is about 80% or less in weight of the whole mixture. If the mixing ratio of the fluorocarbon compound gas were larger than 80%, the effect of improving the deposition rate would not be sufficiently achieved. If only the fluorocarbon compound gas were used, the deposition target object would be etched in some cases depending on the material thereof. More preferably, the mixing ratio in weight of the fluorocarbon compound gas is from about 20% to about 70%.

The carbon film may be typically a DLC (Diamond Like Carbon) film. The DLC film has a good lubricating property as well as a high resistance against wearing which may be caused by friction with another object. Further, the DLC film has an appropriate hardness, and the thickness thereof can be adjusted so that the deposition target object having flexibility can keep its flexibility even after the film deposition. Furthermore, it has a good gas barrier property. Since the thickness can be controlled to be optically transparent, the contents in the object coated with the DLC film can be visible. Therefore, the DLC film is suitable as the film to be formed over the hollow object used as a container. Further, the DLC film can be formed at a relatively low temperature so that the film formation can be performed easily.

In the plasma CVD, the carbon compound gas is used as the deposition material gas, and the deposition is performed with the pressure of about 100 mTorr and the temperature of 100° C. or less, whereby the DLC film is formed. As the deposition temperature is increased, the deposited film has a higher hardness. At the temperature of 500° C. or more, the deposited carbon film can have a very high wear resistance. At the deposition temperature of 900° C. or more, a diamond film is formed.

A plurality of internal electrodes may be used so that batch processing can be performed to form films simultaneously on a plurality of hollow objects. This improves the productivity.

The material of the deposition target object is not particularly restricted. Even if the deposition target object is a hollow object made of an electrically insulating material such as ceramics, glass or polymer material (resin, rubber or the like), a plasma sheath can be formed along or substantially along the outer surface of the object by using the electrode according to the invention. Thereby, the film can be deposited uniformly or substantially uniformly on the outer surface of the object.

A hard carbon film such as a DLC film may be formed on the outer surface of the hollow object, which is made of a polymer material having a relatively low hardness, a low lubricating property and a low gas barrier property. The film thus formed can improve the properties such as the wear resistance, lubricating property and gas barrier property of the object.

The resin may be, e.g., the following thermoplastic resin. The thermoplastic resin may be vinyl resin (polyvinyl chloride, polyvinyl dichloride, polyvinyl butyrate, polyvinyl alcohol, polyvinyl acetate, polyvinyl formal or the like), polyvinylidene chloride, chlorinated polyether, polyester resin (polystyrene, styrene-acrylonitrile copolymer or the like), ABS, polyethylene, polypropylene, polyacetal, acrylic resin (polymethyl methacrylate, modified acrylic resin or the like), polyamide resin (nylon 6, 66, 610, 11 or the like), cellulosic resin (ethyl cellulose, cellulose acetate, propyl cellulose, cellulose acetate butyrate, cellulose nitrate or the like), polycarbonate, phenoxy resin, fluoride resin (chlorotrifluoroethylene, tetrafluoroethylene, tetrafluoroethylene.hexafluoropropylene, vinylidene fluoride or the like), or polyurethane or the like.

The resin may be thermosetting resin. The thermosetting resin may be, e.g., phenol-formaldehyde resin, urea resin, melamine-formaldehyde resin, epoxy resin, furan resin, xylene resin, unsaturated polyester resin, silicone resin, diallyl phthalate resin or the like.

The rubber may be natural rubber, butyl rubber, ethylene-propylene rubber, chloroprene rubber, chlorinated polyethylene rubber, epichlorohydrin rubber, acrylic rubber, nitrile rubber, urethane rubber, silicone rubber, fluororubber or the like.

Embodiments of the invention will now be described with reference to the drawings.

FIG. 1 shows a schematic structure of an example of a plasma CVD device.

This device differs from the device shown in FIG. 9 in that the rod-like internal electrodes 21 arranged on the support member 21' are replaced with an internal electrode 4 having an umbrella-rib-like structure. The umbrella-rib-like internal electrode 4 has a central member 41 of a rod-like form. Fixing members 46 and 46' each having a ring-like form are fitted and fixed to a tip end and a central portion of the central member 41, respectively. The tip end of the central member 41 is located in the bottom of the deposition target object S during deposition. Ring members 43 and 43' are fitted to the portions of the central member 41, which are shifted toward an opening S1 of the object S with respect to the fixed members 46 and 46', respectively. A plurality of rod-like or belt-like closable (in other words, openable) members 42 and 42' are angularly equally spaced from each other, and are coupled to the fixing members 46 and 46', respectively. More specifically, one end of each closable member 42 or 42' is pivotably coupled to the fixing member 46 or 46'. One end of a thin rod-like coupling member 44 or 44' is pivotably coupled to a portion of each closable member 42 or 42' spaced from the foregoing one end. The other end of the thin rod-like coupling member 44 or 44' is pivotably coupled to the ring members 43 or 43'. The ring members 43 and 43' fitted around the central member 41 are coupled together by a coupling member 47. A drive member 45 is coupled to the ring members 43' near the opening S1 of the object S. By moving the member 45 along the central member 41, the ring members 43 and 43' can be slid along the central member 41. By moving the drive member 45 upward in FIG. 1, the closable members 42 and 42' can be set to the open state. By moving the drive member 45 downward in FIG. 1, the closable members 42 and 42' can be set to the closed state. In either the open or closed state, a stop device 48 can fix the drive member 45 to the central member 41. The stop device 48 is arranged on the central member 41 and has a clip-like structure, although not restricted thereto. The electrode 4 in the closed state takes the form which can be passed through the opening S1 of the hollow object S. The electrode 4 in the open state takes the form expanded substantially fully in the inner space of the hollow object S.

The matching box 22 and the high-frequency power source 23 are connected to the central member 41. Although the deposition target object S is supported on the internal electrode 4 in the above example, the object S may be supported by a support member other than the electrode 4.

Structures other than the above are the same as those of the device in FIG. 9. The substantially same parts bear the same reference numbers.

For depositing the film on the outer surface of the hollow object S by this device, the closable members 42 and 42' of the internal electrode 4 are folded along the central member 41 to attain the closed state, and the hollow object S is fitted over the electrode 4 by inserting the electrode 4 through the opening S1. Thereby, the hollow object S is supported by the electrode 4. Then, the drive member 45 is moved upward in the figure, and thereby the ring members 43 and 43' are slid upward along the central member 41 so that closable members 42 and 42' are set to the open state and therefore expand fully in the inner space of the object S. An exhaust device 11 is operated to reduce the pressure in a chamber 1 to a predetermined pressure, and the gas supply portion 3 supplies the deposition material gas into the chamber 1. Also, the high-frequency power source 23 supplies a high-frequency power for gas plasma formation to the internal electrode 4 via the matching box 22 so that the plasma is produced from the material gas already supplied. The film is deposited on the outer surface of the object S under the plasma thus produced.

According to the deposition device and method, a plasma sheath can be formed in a region extending substantially along the outer surface of the hollow object S, and therefore the film can be formed uniformly or substantially uniformly on the surface.

Figure 2:
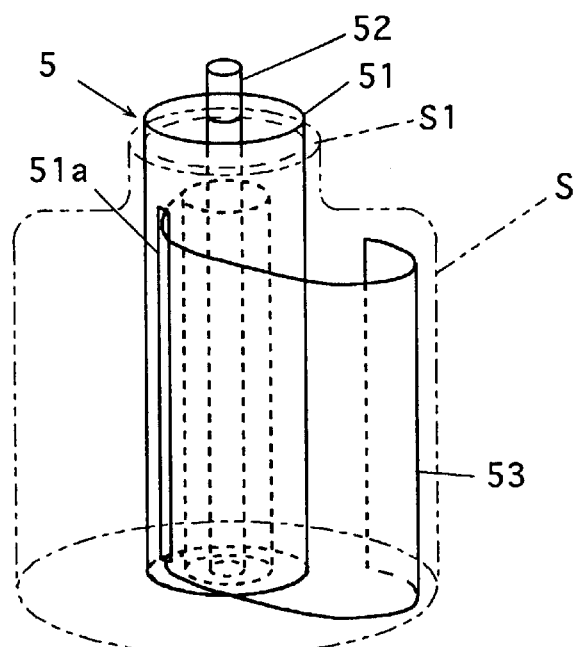
FIG. 2 shows a schematic structure of another example of an electrode according to the invention.

FIG. 2 shows a schematic structure of another example of the electrode. This electrode 5 can be used instead of the internal electrode 4 in the plasma CVD device shown in FIG. 1, and has an outer cylindrical member 51 having a diameter, which is smaller than the inner diameter of the opening S1 of the hollow object S, i.e., the deposition target object, as well as a central shaft 52 which is rotatably supported in the outer cylindrical member 51. Further, an end of a flexible sheet-like electrode member 53 is connected to the central shaft 52. The sheet-like electrode member 53 has a width (height in the position during deposition) allowing close fitting of the member 53 within the main body of the hollow object S. The outer cylindrical member 51 is provided with a slit 51a through which the sheet-like electrode member 53 can pass. The sheet-like electrode member 53 can be rolled up around the central shaft 52 by rotating the shaft 52. Also, the sheet-like electrode member 53 can be paid off into the inner space of the object S through the slit 51a of the outer cylindrical member 51 by reversely rotating the central shaft 52.

This electrode 5 is replaced with the internal electrode 4 in the plasma CVD device shown in FIG. 1 for forming the film on the outer surface of the hollow object S. For the film formation, the sheet-like electrode member 53 is initially kept in the rolled form around the central shaft 52 and is accommodated in the outer cylindrical member 51. The hollow object S is fitted around the electrode 5 in the above state by inserting the electrode 5 through the opening S1, and is supported by the electrode 5. Then, the sheet-like electrode member 53 is paid off along the inner surface of the object S through the slit 51a of the outer cylindrical member 51. In this state, the deposition is performed. During the processing, the high-frequency power source is connected to the central shaft 52.

Operations other than the above are similar to those of the device shown in FIG. 1. The effect of forming the film uniformly or substantially uniformly on the outer surface of the hollow object S can likewise be achieved.

Figure 3:
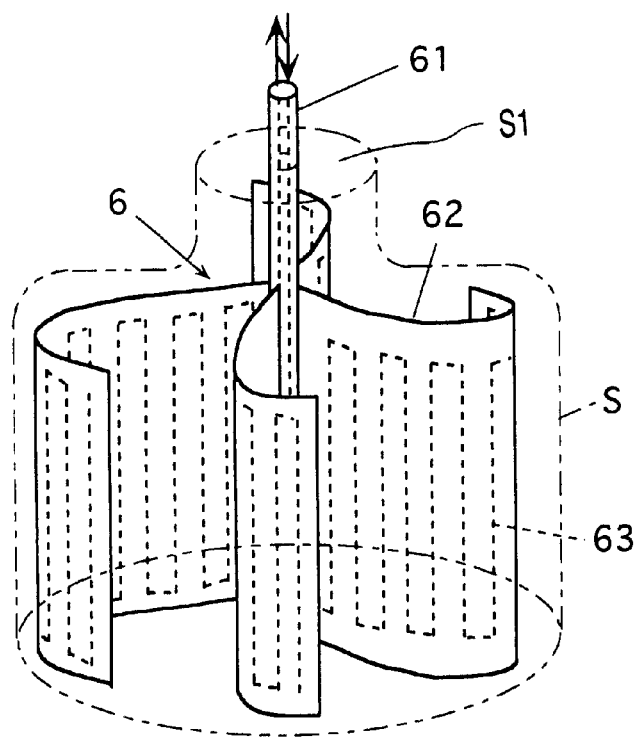
FIG. 3 shows a schematic structure of still another example of the electrode according to the invention.

FIG. 3 shows a schematic structure of still another example of the electrode. An electrode 6 can be used in place of the internal electrode 4 in the plasma CVD device shown in FIG. 1. The electrode 6 is formed of a rod-like central member 61 and a plurality of (four, in this example) closable plate-like members 62 which are arranged around the central member 61 with an equal angular space therebetween, and are coupled to the member 61. The central member 61 has a smaller diameter than the inner diameter of the opening S1 of the hollow object S which is the deposition target object. The closable member 62 has a width in the length direction (i.e., the size in the depth direction of the deposition target object disposed in the deposition position), which is determined to allow close fitting thereof in the main body of the object S.

The closable member 62 of this electrode 6 is made of shape-memory alloy. The closable member 62 at the memory temperature (high temperature) is in the matrix phase. The closable member 62 in this matrix phase attains the open state, and therefore expands substantially entirely in the inner space of the deposition target object S. Each of the four closable members 62 has an end connected to the central member 61, and the other end thereof is slightly bent in the uniform direction so as to locate the member 62 along the inner surface of the object S when it is inserted into the hollow object S. The electrode 6 at a low temperature is in the martensite phase, and the closable member 62 in this state can be deformed into the closed state, and thereby can be wound around the central member 61. The electrode 6 in the closed state takes the reduced form which allows passage of the electrode 6 through the opening S1 of the hollow object S.

In this example, the electrode 6 is provided with a passage 63 which extends throughout the electrode 6 for flowing the cooling or heating fluid. A fluid circulating device (not shown) circulates the cooling or heating fluid through the passage 63 so that the temperature of the electrode 6 can be controlled. In stead of the fluid passage 63, the heater or cooler may be arranged entirely on the electrode 6 so that the temperature of the electrode may be controlled.

In the depositing device, the high-frequency power source is connected to the central member 61.

For forming the film on the outer surface of the object S by using the electrode 6 instead of the internal electrode 4 in the plasma CVD device shown in FIG. 1, the electrode 6 is initially cooled by flowing the fluid, which is cooled or controlled to attain a predetermined low temperature, through the passage 63 so that the electrode 6 attains the martensite phase and therefore is deformed into the closed state. The deposition target object S is fitted around the electrode 6 thus closed by inserting the electrode 6 into the object S through its opening S1, and is supported by the electrode 6.

Then, the fluid at the predetermined controlled high temperature is circulated through the fluid passage 63 to heat the closable member 62 so that the closable member 62 attains and maintains the open state during the deposition.

Even if the temperature control by the fluid is not performed, the member 62 made of the shape-memory alloy may attain the matrix phase at the temperature during the plasma CVD. In this case, the temperature control is not required during the deposition process.

Operations other than the above are similar to those of the device shown in FIG. 1. The effect of forming the film uniformly or substantially uniformly on the outer surface of the hollow object S can likewise be achieved.

Figure 4:
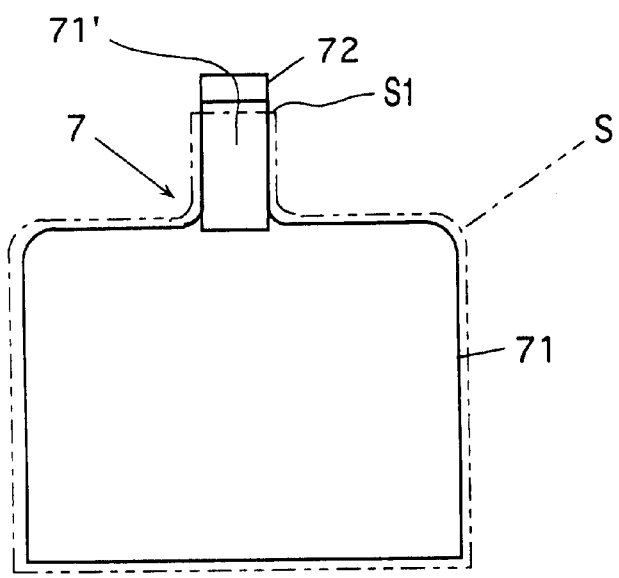
FIG. 4 shows a schematic structure of yet another example of the electrode according to the invention.

FIG. 4 shows a schematic structure of yet another example of the electrode. An electrode 7 can be used in place of the internal electrode 4 in the plasma CVD device shown in FIG. 1. In this example, the electrode 7 is formed of a bag-like electrode 71 made of electrically conductive rubber and a rod-like electrode member 72 having a diameter which allows the member 72 to be inserted into and thereby close an opening 71' of the bag-like electrode 71. In the deposition device, the electrode member 72 is connected to the power source.

For forming the film on the outer surface of the object S by using the electrode 7 instead of the internal electrode 4 in the plasma CVD device shown in FIG. 1, the bag-like electrode 71 is inserted into the hollow object S which is the deposition target object, and then is expanded to fill substantially entirely the inner space of the object S by supplying the air into the electrode 71. The electrode 71 thus expanded is closed by the electrode member 72, and the deposition is performed in this state. The deposition target object S is supported by an appropriate support member. The electrode member 72 may be connected to an inlet pipe of an air or the like.

Operations other than the above are similar to those of the device shown in FIG. 1. The effect of forming the film uniformly or substantially uniformly on the outer surface of the hollow object S can likewise be achieved.

Although the bag-like electrode in the above example is made of the electrically conductive rubber, a bag-like electrode may be made of an electrically conductive material having no expandability or stretchability. In this case, the bag-like electrode may be configured such that the electrode can be folded and inserted into the object S, and can be expanded to fill substantially entirely the inner space of the object S by supplying an air thereinto. The flowable material supplied into the bag-like electrode is not restricted to the air, and may be, e.g., a gas, a liquid or solid particles which can flow through the opening S1 of the object S. The bag-like electrode may be formed of a bag, which is made of rubber or the like and therefore is not electrically conductive. In this case, an electrically conductive film or a coating of an electrically conductive material is formed over the outer surface of the bag.

Figure 5:
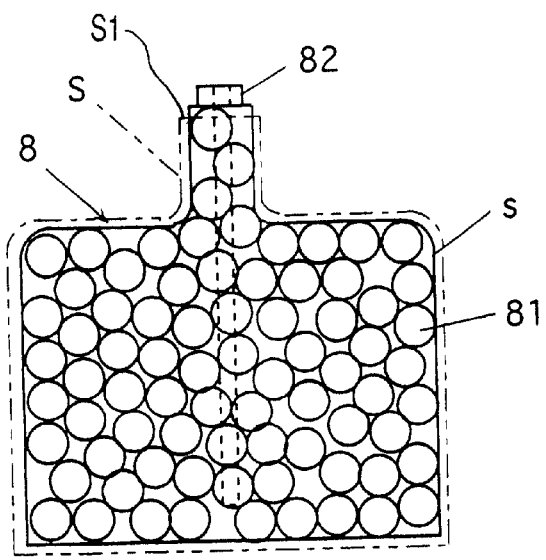
FIG. 5 shows a schematic structure of further another example of the electrode according to the invention.

FIG. 5 shows a schematic structure of further another example of the electrode. An electrode 8 can be used in place of the internal electrode 4 in the plasma CVD device shown in FIG. 1. The electrode 8 is formed of electrically conductive particles 81, which can pass through the opening S1 of the object S, and a rod-like electrode member 82 which is inserted into the object S through the opening S1.

For forming the film on the outer surface of the object S by using the electrode 8 instead of the internal electrode 4 in the plasma CVD device shown in FIG. 1, a bag-like sheet s is placed in advance within the object S, and the conductive particles 81 are supplied into the bag-like sheet s to fill the inner space of the object S. The conductive particles 81 may be directly placed in the object S without using the sheet s. The electrode member 82 is inserted into the object S through its opening Si. The power source is connected to the electrode member 82. The deposition is performed in the above state. In contrast to the case using the plasma CVD device shown in FIG. 1, the hollow object S is placed on an appropriate support member during the film deposition so that the particles 81 may not drop from the object S.

Operations other than the above are similar to those of the device shown in FIG. 1. The effect of forming the film uniformly or substantially uniformly on the outer surface of the hollow object S can likewise be achieved.

Instead of the electrically conductive particles used in the above example, it is possible to use an electrically conductive fluid such as electrically conductive metal (e.g., mercury) which takes the form of liquid at the room temperature, or a suspension containing electrically conductive powder in liquid having a high viscosity.

Figure 6:
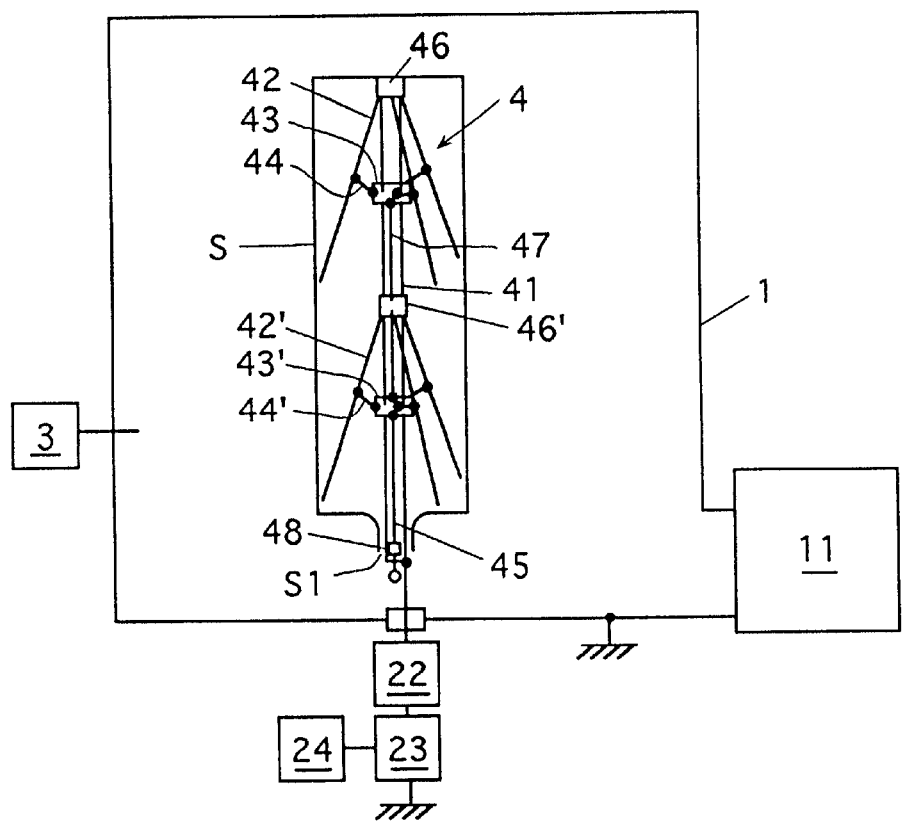
FIG. 6 shows a schematic structure of another example of a plasma CVD device according to the invention.

FIG. 6 shows a schematic structure of further another example of a plasma CVD device. This device corresponds to the device shown in FIG. 1, and additionally includes an arbitrary waveform generating device 24 connected to a high-frequency power source 23. Structures other than the above are similar to those of the device shown in FIG. 1. The substantially same portions bear the same reference numbers.

For forming the film on the outer surface of the object S by this device, the pulse-modulated high-frequency power which is prepared by the high-frequency power source 23 and the arbitrary-waveform generating device 24 is supplied to the internal electrode 4 via the matching box 22, whereby the plasma is produced from the deposition material gas.

The pulse-modulated high-frequency power is prepared by effecting amplitude modulation on a basic high-frequency power of a predetermined frequency of 13.56 MHz or more with a modulation frequency in a range from one ten-thousandth to one tenth of the predetermined frequency. The duty ratio ((on-time)/(on-time+off-time)) of the pulse modulation is 50%. Other operations are similar to those for the film deposition by the device shown in FIG. 1.

According to the device shown in FIG. 6 and the film deposition by this device, the high-frequency power prepared by the above pulse modulation is used as the power to be supplied for producing the plasma from the deposition material gas, whereby the plasma can have a high density so that a rate of reaction is improved and the deposition can be performed at a low temperature. By effecting the modulation as described above, the reaction is promoted on the outer surface of the object so that the film adhesion can be improved, and the deposition rate or speed can be improved.

The internal electrodes shown in FIGS. 2 to 5 may be used together with the pulse-modulated high-frequency power described above.

Description will now be given on practical examples, which used the plasma CvD devices shown in FIGS. 1 and 6 as well as a similar device provided with a modified internal electrode or the like for forming DLC films on the outer surfaces of the hollow deposition target objects made of polyethylene terephthalate.

EXAMPLE 1

(Device in FIG. 1)
Hollow Object
   Material: polyethylene terephthalate
   Configuration:
      cylindrical main body: diameter=100 mm, height=80 mm, thickness=0.1 mm
      cylindrical opening: diameter=40 mm, height=20 mm, thickness=0.1 mm
Electrode
   material: stainless steel
      configuration: diameter of central member=10 mm, height=120 mm
      maximum diameter in the open state=90 mm
Deposition Conditions
   deposition material gas: hydrogen ($H_2$) 20 sccm methane ($CH_4$) 20 sccm
High-Frequency Power
   frequency: 13.56 MHz, 100 W deposition pressure: 0.1 Torr
deposition temperature: room temperature
deposition time: 60 minutes

EXAMPLE 2
(The device was provided with the electrode 6 in FIG. 3 instead of the electrode 4 in FIG. 1.)
Hollow Object
   the same as the example 1
Electrode
   material
      central member 61: stainless steel (JIS:SUS304)
      closable member 62: alloy containing Ti—Ni, Cu—Zn—Al or Cu—Al—Ni
   configuration
      central member 61: diameter=10 mm, height=120 mm
      closable member 62: height=about 80 mm
      maximum diameter in the open state=90 mm
Deposition Conditions
   the same as the example 1

EXAMPLE 3
(The device was provided with the electrode 8 in FIG. 5 instead of the electrode 4 in FIG. 1, and was provided with the conductive fluid instead of the conductive particles 81.)
Hollow Object
   the same as the example 1
Electrode
   material
      electrode member 82: stainless steel (JIS:SUS304)
      conductive fluid: mercury
   configuration
      electrode member 82: diameter 5 mm
Deposition Conditions
   the same as the example 1

EXAMPLE 4
(The device was provided with the electrode 8 in FIG. 5 instead of the electrode 4 in FIG. 1.)
Hollow Object
   the same as the example 1
Electrode
   material
      electrode member 82: stainless steel (JIS:SUS304)
      conductive flowable material 81: stainless steel SUS304
   configuration
      electrode member 82: diameter=5 mm
      conductive flowable material 81:
      spherical particles of 5 mm in diameter
Deposition Conditions
   the same as the example 1

EXAMPLE 5
(The device was provided with the electrode 7 in FIG. 4 instead of the electrode 4 in FIG. 1.)
Hollow Object
   the same as the example 1
Electrode
   material
      electrode member 72: stainless steel (JIS:SUS304)
      bag-like electrode 71:
      formed of a bag made of conductive rubber containing carbon black, or silicone rubber or EPDM and a film made of Cu, Ni or Ag and formed on the surface of the bag by ion vapor deposition (IVD).

The bag-like electrode 71 was expanded by supplying the air thereinto, and the inlet portion of the bag-like electrode 71 was folded inward for contact of the electrode member 72 with the conductive surface or film of the electrode 71, and the electrode 72 was arranged at the folded inlet portion.
Deposition Conditions
   the same as the example 1

Example 6
(The device was provided with the electrode 8 in FIG. 5 instead of the electrode 4 in FIG. 1.)

A DLC film was formed on the outer surface of the object S in a manner similar to that of the example 4 except for that methane ($CH_4$, 20 sccm) and hexafluoroethane ($C_2F_6$, 20 sccm) were used as the deposition material gas.

EXAMPLE 7
(The device was provided with the electrode 8 in FIG. 5 instead of the electrode 4 in FIG. 6.)

A DLC film was formed on the outer surface of the object S in a manner similar to that of the example 4 except for that the high-frequency power for gas plasma formation was prepared by effecting amplitude modulation on a basic high-frequency power of a predetermined frequency of 13.56 MHz (100 W) with a modulation frequency of 1 kHz and a duty ratio of 50%.

EXAMPLE 8
(The device was provided with the electrode 8 in FIG. 5 instead of the electrode 4 in FIG. 6.)

A DLC film was formed on the outer surface of the object S in a manner similar to that of the example 4 except for that the high-frequency power for gas plasma formation was prepared by effecting amplitude modulation on a basic high-frequency power of a predetermined frequency of 13.56 MHz (100 W) with a modulation frequency of 1 kHz and the duty ratio of 50%, and that methane ($CH_4$, 20 sccm) and hexafluoroethane ($C_2F_6$, 20 sccm) were used as the deposition material gas.

In other words, the DLC film was formed on the outer surface of the object S in a manner similar to that of the example 6 except for that the high-frequency power for gas plasma formation was prepared by effecting amplitude modulation on a basic high-frequency power of a predetermined frequency of 13.56 MHz (100 W) with a modulation frequency of 1 kHz and the duty ratio of 50%. It can also be considered that the DLC film was formed on the outer surface of the object S in a manner similar to that of the example 7 except for that methane ($CH_4$, 20 sccm) and hexafluoroethane ($C_2F_6$, 20 sccm) were used as the deposition material gas.

Comparative Example
(The device in FIG. 9 was used.)

The plasma CVD device shown in FIG. 9 was provided with the rod-like internal electrode 21 made of a stainless steel and having a diameter of 35 mm and a height of 120 mm. By this device, it was attempted to from a DLC film on the outer surface of the hollow object S under the same deposition conditions as those of the example 1. However, the film could not be formed.

As a result, it can be understood that the plasma CVD device provided with the electrode of the invention enables the formation of the film on the outer surface of the hollow object, which has a main body larger in diameter than its opening, and is made of an electrically insulating material.

Evaluation relating to the uniformity in film thickness, film adhesion, hardness, gas barrier properties was made on the objects coated with the respective DLC films of the foregoing examples 1 to 6 as well as the object prepared by the foregoing comparative example. The deposition rates in the respective examples were calculated. The evaluation relating to the lubricating properties was made on the DLC-film-coated objects obtained in the foregoing examples 4, 6, 7 and 8.

The uniformity in film thickness was evaluated in the following manner. The film thickness was measured by a level difference measuring device at four points, which are spaced from each other in the height direction and obtained by equally dividing into five sections the portion of the main body of the deposition target object except for its opposite end portions each having a length of 10 mm. The above evaluation was made based on differences in measured thickness. The film adhesion was evaluated in the following manner. Films were deposited under the same conditions as those in the foregoing examples on silicon wafers of 4 inches in diameter, respectively, and the film stresses of these films were determined by measuring the deflections before and after the deposition by a laser displacement meter. It was evaluated that the example exhibiting the lower film stress had the better adhesion. The hardness was evaluated by measuring the Knoop hardness(Load:0.5-gram). The gas barrier property was evaluated by measuring the transmission speed of oxygen between the interior and exterior(0% of oxygen) of the hollow deposition target object containing 100% of oxygen. This measurement was performed at the temperature of 25° C. by a gas transmission measuring device manufactured by Mocon Corporation. The lubricating properties were evaluated as follows. A pin-like object which is made of aluminum and is provided with a tip end having a curvature radius of 18 mm was brought into contact with the film or the object surface, and the pin-like object bearing a load of 10 grams was moved at a speed of 20 mm/second. Under these conditions, the coefficients of friction were measured. The results are shown in the following tables 1 and 2.

TABLE 1

|  | D/R (nm/min) | T/D (%) | F/S (dyne/cm$^2$) | K/H (KNH) | O/T (cc/cm$^2$/day) |
|---|---|---|---|---|---|
| EX 1 | 15 | ±8 | 3 × 10$^9$ | 30 | 1.5 |
| EX 2 | 16 | ≦±6 | 3 × 10$^9$ | 30 | 1.5 |
| EX 3 | 20 | ≦±5 | 3 × 10$^9$ | 30 | 1.3 |
| EX 4 | 18 | ≦±6 | 3 × 10$^9$ | 30 | 1.5 |
| EX 5 | 16 | ≦±7 | 3 × 10$^9$ | 30 | 1.5 |
| EX 6 | 32 | ≦±6 | 1 × 10$^9$ | 15 | 0.7 |
| C/E | — | — | — | — | 14 |

D/R: deposition rate
T/D: thickness distribution
F/S: film stress
K/H: Knoop hardness
O/T: oxygen transmissivity
EX: example
C/E: comparative example

TABLE 2

|  | friction coefficient |
|---|---|
| EX 4 | 0.2 |
| EX 6 | 0.15 |

TABLE 2-continued

|  | friction coefficient |
|---|---|
| EX 7 | 0.1 |
| EX 8 | 0.05 |

From the results in the table 1, it is understood that the objects of the examples 1–6 provided with the DLC films have the significantly reduced oxygen transmissivities and therefore have extremely improved gas barrier properties, compared with the comparative example which could not form the film. In the example 6 which corresponds to the example 4 and additionally uses the fluorocarbon gas as the deposition material gas, it is understood that the deposition rate is improved, the film stress is reduced and the oxygen transmissivity is lowered. It can be understood that the DLC film formation using, as the deposition material gas, the fluorocarbon compound gas in addition to the hydrocarbon compound gas can improve the deposition rate, film adhesion and gas barrier properties.

From the result of the table 2, it can be understood that the example 6, which corresponds to the example 4 but uses, as the deposition material gas, the fluorocarbon compound gas in addition to the hydrocarbon compound gas, can provide the DLC-film coated object having a reduced friction coefficient with respect to an aluminum member and therefore having improved lubricating properties. It can also be understood that the example 7, which corresponds to the example 4 but uses the pulse-modulated high-frequency power for the gas plasma formation high-frequency power, can provide further improved lubricating properties. Further, it can be understood that the example 8, which corresponds to the example 4 but uses the deposition material gas formed of the fluorocarbon compound gas and the hydrocarbon compound gas as well as the pulse-modulated high-frequency power for the gas plasma formation high-frequency power, can provide lubricating properties which are further improved from those of the examples 6 and 7.

Figure 7:
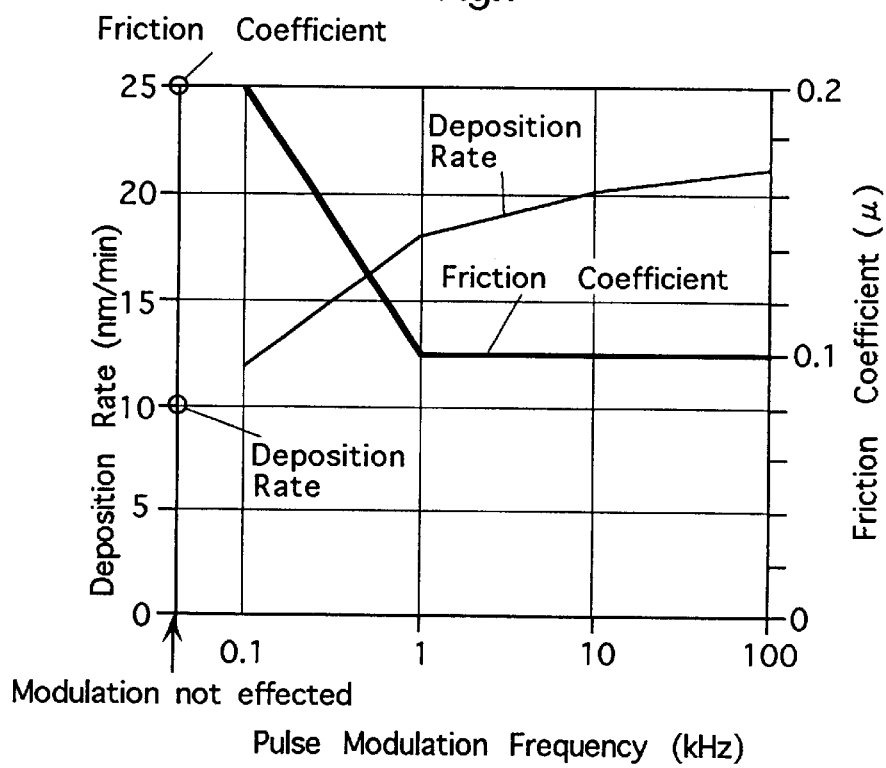
FIG. 7 shows, by way of example, a relationship between a modulation frequency of a pulse modulation high-frequency power for gas plasma formation and a deposition rate as well as a relationship between the modulation frequency and a friction coefficient with respect to an aluminum member.

The DLC film formation was performed by the device corresponding to that in FIG. 6 but provided with the electrode 8 in FIG. 5 instead of the electrode 4. In this film formation, the power for gas plasma formation was prepared by effecting pulse modulation on a basic high-frequency power of a predetermined frequency of 13.56 MHz with a modulation frequency in the range from 0.1 kHz to 100 kHz (i.e., from one hundred-thousandth to one hundredth of the frequency of the basic high-frequency power). Determination was made on changes in deposition rate as well as changes in friction coefficient with respect to the aluminum member, which are caused by changes in modulation frequency. The results are shown in FIG. 7.

As a result, it can be understood that the higher modulation frequency within the foregoing range can improve the deposition rate to a higher extent. The deposition rate is 10 nm/minute when the modulation is not effected. It can be understood that the modulation frequency of about 1 kHz (about one ten-thousandth of the frequency of the basic high-frequency power) or more is preferable.

The friction coefficient with respect to the aluminum member was 0.2 if the modulation is not effected, and is 0.1 if the modulation is effected with the modulation frequency from 1 kHz to 100 kHz (in a range from one ten-thousandth to one hunredth of the frequency of the basic high-frequency power). From this, it can be understood that the modulation improves the friction coefficient and the lubricating properties. The modulation frequency of 0.1 kHz (one hundred-thousandth of the frequency of the basic high-frequency power) provides the friction coefficient of 0.2, and thus does not improve the friction coefficient.

Figure 8:
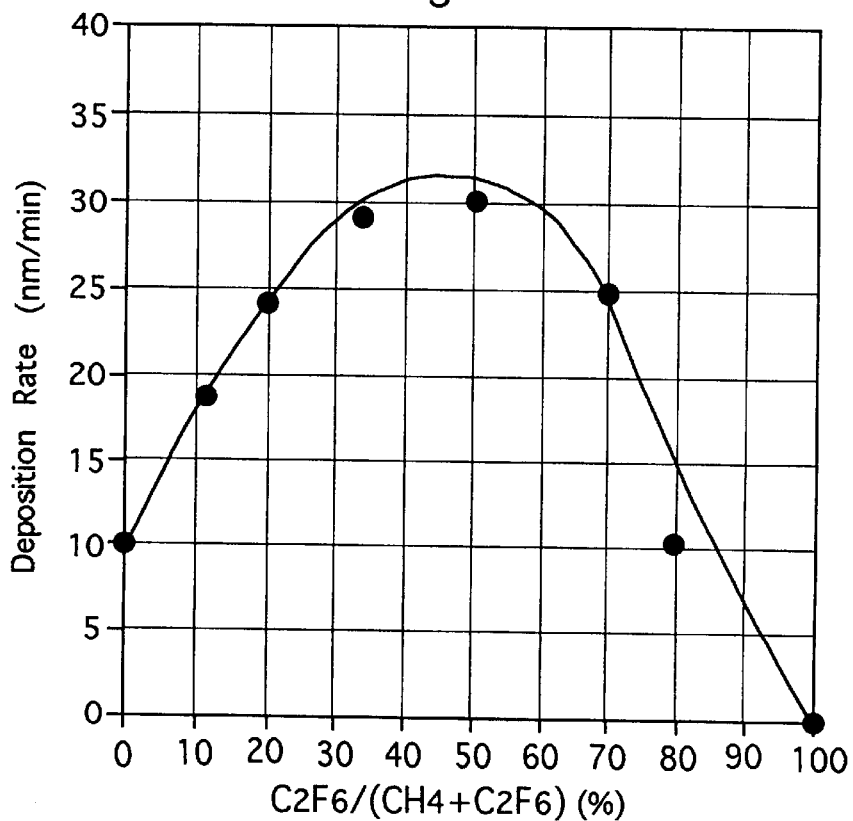
FIG. 8 shows, by way of example, a relationship between a mixing ratio of a fluorocarbon gas in the deposition material gas and the deposition rate in the process of forming a carbon film by the method of the invention.

In the example 6, the deposition was performed with various mixing ratios of hexafluoroethane (($C_2F_6$)/($CH_4$+$C_2F_6$)) in the deposition material gas, which were in a range from 0 to 1 in weight, and the deposition rate was measured. The result was shown in FIG. 8. From this, it can be understood that the mixing of hexafluoroethane at the mixing ratio of 80% or less can improve the deposition rate, compared with the case in which only the methane gas is used. It can also be understood that the mixing ratio of hexafluoroethane higher than 80% lowers the deposition rate.

Industrial Applicability

The invention can be applied, e.g., to formation of a uniform or substantially uniform film (e.g., DLC film), which must have characteristics such as a high wear resistance and a gas barrier property, on an outer surface of a container containing a food, medicinal drug or the like.

What is claimed is:

1. A plasma CVD method for forming a plasma from a deposition material gas by supplying an electric power to said gas, and forming a film on an outer surface of a hollow object having an opening under said plasma, wherein an internal electrode to be arranged in an inner space of said hollow object and an external electrode to be arranged outside said object are prepared as electrodes for supplying said electric power for forming the plasma, said internal electrode including a central rod member, a predetermined number of closable members arranged around the central rod member with a predetermined angular space between each of the closable members and each having an end rotatably connected to a predetermined portion of the central rod member and the other end rotatably connected to a ring member slidably fitted around the central rod member in a closable fashion, and a drive portion including a drive member coupled to a central rod member for sliding the ring member on the central rod member and being capable of sliding the ring member to close the closable members for attaining a reduced form allowing passage of said internal electrode through said opening of said hollow object, and to open the closable members for attaining an enlarged form predetermined in accordance with a volume and a shape of the inner space of said object, said internal electrode is closed to attain said reduced form by the operation of said drive portion and is inserted into the inner space of said object through said opening of said object before forming the film on said outer surface of said object, then is changed into said enlarged form by the operation of said drive portion and is kept within said object, and said electric power for forming the gas plasma is supplied across said internal electrode and said external electrode for forming the film on the outer surface of said object.

2. The plasma CVD method according to claim 1, wherein said power for forming the gas plasma is prepared by effecting amplitude modulation on a basic high-frequency power of a predetermined frequency of 13.56 MHz or more with a modulation frequency in a range from one ten-thousandth to one tenth of said predetermined frequency.

3. The plasma CVD method according to claim 1, wherein a gas containing a hydrocarbon compound gas and a fluorocarbon compound gas is used as said deposition material gas for forming a carbon film.

4. A plasma CVD method for forming a plasma from a deposition material gas by supplying an electric power to said gas, and forming a film on an outer surface of a hollow object, having an opening under said plasma, wherein an internal electrode to be arranged in an inner space of said hollow object and an external electrode to be arranged outside said object are prepared as electrodes for supplying said electric power for forming the plasma, said internal electrode including an outer cylindrical member being movable through the object opening, a central axis rod having a drive portion and rotatably supported in the outer cylindrical member, and a closable flexible sheet electrode member having an end connected to the central axis rod and movable between positions inside and outside the outer cylindrical member through a slit formed in the outer cylindrical member by an operation of rotating the central axis rod by the drive portion, and said internal electrode being capable of selectively having a reduced form allowing passage of said internal electrode through said opening of said hollow object by rotating the central axis rod to roll up the sheet electrode member, and an enlarged form predetermined in accordance with a volume and a shape of the inner space of said object by rotating the central axis rod to pay out the sheet electrode member along the inner wall surface of the inner space of the object, said internal electrode is closed to attain said reduced form by the operation of said drive portion and is inserted into the inner space of said object through said opening of said object before forming the film on said outer surface of said object, then is changed into said enlarged form by the operation of said drive portion and is kept within said object, and said electric power for forming the gas plasma is supplied across said internal electrode and said external electrode for forming the film on the outer surface of said object.

5. The plasma CVD method according to claim 4, wherein said power for forming the gas plasma is prepared by effecting amplitude modulation on a basic high-frequency power of a predetermined frequency of 13.56 MHz or more with a modulation frequency in a range from one ten-thousandth to one tenth of said predetermined frequency.

6. The plasma CVD method according to claim 4, wherein a gas containing a hydrocarbon compound gas and a fluorocarbon compound gas is used as said deposition material gas for forming a carbon film.

7. A plasma CVD method for forming a plasma from a deposition material gas by supplying an electric power to said gas, and forming a film on an outer surface of a hollow object having an opening under said plasma, wherein an internal electrode to be arranged in an inner space of said hollow object and an external electrode to be arranged outside said object are prepared as electrodes for supplying said electric power for forming the gas plasma, said internal electrode including at least one kind of flowable material selected from among electrically conductive liquid and solid particles and capable of flowing, on its own, between the inner and outer spaces of said object through the opening of said object, said internal electrode is formed by flowing said conductive and flowable material into the inner space of said object through said object opening before forming the film on the outer surface of said object, and said electric power for forming the gas plasma is supplied across said internal electrode and said external electrode for forming the film on the outer surface of said object.

8. The plasma CVD method according to claim 7, wherein said power for forming the gas plasma is prepared by effecting amplitude modulation on a basic high-frequency power of a predetermined frequency of 13.56 MHz or more with a modulation frequency in a range from one ten-thousandth to one tenth of said predetermined frequency.

9. The plasma CVD method according to claim 7, wherein a gas containing a hydrocarbon compound gas and a fluorocarbon compound gas is used as said deposition material gas for forming a carbon film.

10. A plasma CVD device for forming a plasma from a deposition material gas by supplying an electric power to said gas, and forming a film on an outer surface of a hollow object having an opening under said plasma, comprising:

an internal electrode to be arranged in an inner space of said hollow object and an external electrode to be arranged outside said object as electrodes for supplying said electric power for forming the gas plasma, wherein said internal electrode includes a central rod member, a predetermined number of closable members arranged around the central rod member with a predetermined angular space between each of the closable members and each having an end rotatably connected to a predetermined portion of the central rod member and the other end rotatably connected to a ring member slidably fitted around the central rod member in a closable fashion, and a drive portion including a drive member coupled to the central rod member for sliding the ring member on the central member, and being capable of sliding the ring member to close the closable members for attaining a reduced form allowing passage of said internal electrode through said opening of said hollow object, and to open the closable members for attaining an enlarged form predetermined in accordance with a volume and a shape of the inner space of said object.

11. The plasma CVD device according to claim 10, wherein means for supplying said power for forming the gas plasma across said inner and outer electrodes is provided and said means can supply a power prepared by effecting amplitude modulation on a basic high-frequency power of a predetermined frequency of 13.56 MHz or more with a modulation frequency in a range from one ten-thousandth to one tenth of said predetermined frequency.

12. A plasma CVD device for forming a plasma from a deposition material gas by supplying an electric power to said gas, and forming a film on an outer surface of a hollow object having an opening under said plasma, comprising:

an internal electrode to be arranged in an inner space of said hollow object and an external electrode to be arranged outside said object as electrodes for supplying said electric power for forming the gas plasma, wherein said internal electrode includes an outer cylindrical member being movable through the object opening, a central axis rod having a drive portion and rotatably supported in the outer cylindrical member, and a closable flexible sheet electrode member having an end connected to the central axis rod and movable between positions inside and outside the outer cylindrical member through a slit formed in the outer cylindrical member by an operation of rotating the central axis rod by the drive portion, said internal electrode being capable of selectively having a reduced form allowing passage of said internal electrode through said opening of said hollow object by rotating the central axis rod to roll up the sheet electrode member, and an enlarged form predetermined in accordance with a volume and a shape of the inner space of said object by rotating the central axis rod to pay out the sheet electrode member along the inner wall surface of the inner space of the object.

13. The plasma CVD device according to claim 12, wherein means for supplying said power for forming the gas plasma across said inner and outer electrodes is provided and said means can supply a power prepared by effecting amplitude modulation on a basic high-frequency power of a predetermined frequency of 13.56 MHz or more with a modulation frequency in a range from one ten-thousandth to one tenth of said predetermined frequency.

14. A plasma CVD device for forming a plasma from a deposition material gas by supplying an electric power to said gas, and forming a film on an outer surface of a hollow object having an opening under said plasma, comprising:

an internal electrode to be arranged in an inner space of said hollow object and an external electrode to be arranged outside said object as electrodes for supplying said electric power for forming the gas plasma, said internal electrode including at least one kind of flowable material selected from among electrically conductive liquid and solid particles and capable of flowing, on its own, between the inner and outer spaces of said object through the opening of said object, and said internal electrode being formed by flowing said conductive and flowable material into the inner space of said object.

15. The plasma CVD device according to claim 14, wherein means for supplying said power for forming the gas plasma across said inner and outer electrodes is provided and said means can supply a power prepared by effecting amplitude modulation on a basic high-frequency power of a predetermined frequency of 13.56 MHz or more with a modulation frequency in a range from one ten-thousandth to one tenth of said predetermined frequency.

16. An internal electrode used in plasma CVD for forming a plasma from a deposition material gas by supplying an electric power to said gas, and forming a film on an outer surface of a hollow object having an opening under said plasma, said internal electrode being arranged in an inner space of said hollow object for allowing supply of the electric power for plasma formation across said internal electrode and an outer electrode arranged outside the hollow object, wherein said internal electrode includes:

a central rod member, a predetermined number of closable members arranged around the central rod member with a predetermined angular space between each of the closable members and each having an end rotatably connected to a predetermined portion of the central rod member and the other end rotatably connected to a ring member slidably fitted around the central rod member in a closable fashion, and a drive portion including a drive member coupled to the central rod member for sliding the ring member on the central member, the drive member being capable of sliding the ring member to close the closable members for attaining a reduced form allowing passage of said internal electrode through said opening of said hollow object, and to open the closable members for attaining an enlarged form predetermined in accordance with a volume and shape of the inner space of said object.

17. An internal electrode used in plasma CVD for forming a plasma from a deposition material gas by supplying an electric power to said gas, and forming a film on an outer surface of a hollow object having an opening under said plasma, said internal electrode being arranged in an inner space of said hollow object for allowing supply of the electric power for plasma formation across said internal electrode and an outer electrode arranged outside the hollow object, wherein said internal electrode includes:

an outer cylindrical member being movable through the object opening, a central axis rod having a drive portion and rotatably supported in the outer cylindrical member, and a closable flexible sheet electrode member having an end connected to the central axis rod and movable between positions inside and outside the outer cylindrical member through a slit formed in the outer cylindrical member by an operation of rotating the central axis rod by the drive portion, said internal electrode being capable of selectively having a reduced form allowing passage of said internal electrode thorough said opening of said hollow object by rotating the central axis rod to roll up the sheet electrode member, and an enlarged form predetermined in accordance with a volume and a shape of the inner space of said object by rotating the central axis rod to pay out the sheet electrode member along the inner wall surface of the inner space of the object.

* * * * *